United States Patent [19]

Besson et al.

[11] 3,996,588
[45] Dec. 7, 1976

[54] SYSTEM FOR AUTOMATIC FREQUENCY CONTROL

[75] Inventors: Yves Besson; Francois Oriol, both of Paris, France

[73] Assignee: Thomson-CSF, Paris, France

[22] Filed: Nov. 11, 1974

[21] Appl. No.: 523,006

[30] Foreign Application Priority Data
June 25, 1974 France .............................. 74.22066

[52] U.S. Cl. ................................ 343/7 A; 331/11; 343/17.5
[51] Int. Cl.² .......................................... G01S 9/02
[58] Field of Search ............. 331/11; 343/17.5, 7 A

[56] References Cited
UNITED STATES PATENTS

3,715,681  2/1973  Madert ................................. 331/11
3,885,238  5/1975  Klein et al. ......................... 343/7 A

*Primary Examiner*—T.H. Tubbesing
*Assistant Examiner*—Richard E. Berger
*Attorney, Agent, or Firm*—Cushman, Darby & Cushman

[57] ABSTRACT

A system for bringing the frequency of an oscillator under the control of the frequency of the carrier of a pulse wherein a parameter characteristic of the carrier frequency value is measured throughout the duration of the pulse, the measurement result is stored, the same parameter is measured in respect of the frequency to be controlled, and the control is carried out after the pulse by comparison of the second measured parameter with the first and stored measured parameter.

15 Claims, 12 Drawing Figures

Fig_10

Fig_11

Fig_12

SYSTEM FOR AUTOMATIC FREQUENCY CONTROL

BACKGROUND OF THE INVENTION

This invention relates to systems for bringing the frequency of an oscillator under the control of the frequency of the carrier of a pulse of very brief duration.

This is a problem arising in the receivers of systems providing electromagnetic detection of very brief pulses where pulse frequency varies between individual pulses, for in such cases the local oscillator frequency of the receiver must also vary but under the control of the variation in the frequency of the pulse, so that the receiver intermediate frequency remains close enough to its rated value to be compatible with the receiver pass band.

The known techniques can provide such a form of control for the duration of the pulse but cease to be satisfactory for pulse duration below 1 microsecond.

The control system according to the invention is of use for much shorter pulses, for instance, lasting 0.25 microseconds.

SUMMARY OF THE INVENTION

According to a feature of the invention, the system comprises means for measuring and storing a parameter characteristic of the carrier frequency value throughout the duration of the pulse, means for measuring the same parameter in respect of the frequency of the oscillator to be controlled, comparing means for comparing after the pulse the second measured parameter with the first and stored measured parameter and control means for controlling the frequency of said oscillator as a function of the result of said comparison. Consequently, only the recording of the frequency takes place within a time limit determined by pulse duration and such recording can of course be made very rapidly.

The invention also relates to automatic frequency control systems using the method.

DESCRIPTION OF THE FIGURES OF THE DRAWINGS

The invention will be better understood from the following description and by reference to the drawings wherein.

DETAILED DESCRIPTION OF ONE EMBODIMENT

Figure 1:
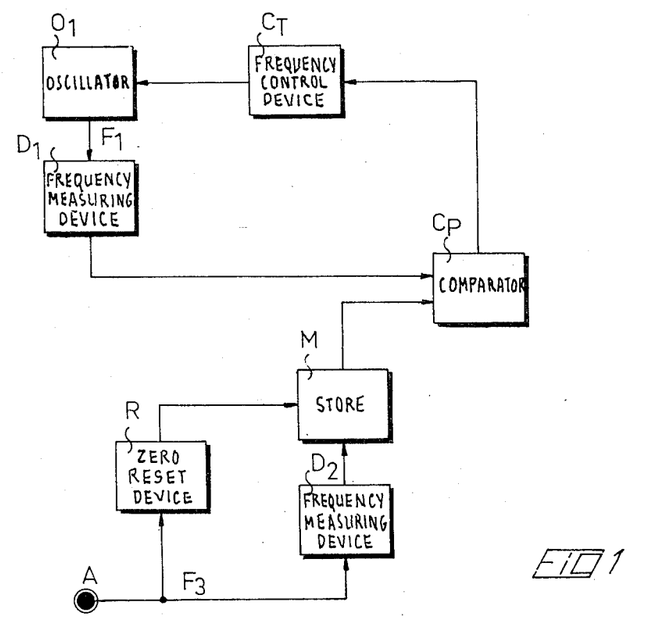
FIG. 1 is a block schematic diagram showing the method according to the invention.

Refering to FIG. 1, there can be seen a frequency-controlled oscillator $O_1$ and an input A; available thereat is a pulse to whose carrier frequency the frequency of oscillator $O_1$ must be controlled. Frequency $F_3$ of the pulse is measured by a frequency-measuring device $D_2$.

The measurement result is stored in a memory M which is zero reset by each fresh pulse. The zero reset is performed by a device R. The frequency of oscillator $O_1$ is measured in a device $D_1$ of the same kind and properties as the device $D_2$. The results of the two measurements are compared in a comparator circuit CP which supplies the control signal for control device CT of oscillator $O_1$.

The foregoing outline is very broad and says nothing about orders of magnitude of the frequencies used nor, therefore, of the nature of the various devices, its purpose being to show the method according to the invention, the main feature thereof being that the time taken to control the local oscillator is independent of pulse duration since such control occurs basically after the pulse, the value of the frequency thereof being stored.

As a rule, the oscillator frequency $F_1$ and the pulse frequency $F_3$ should not be equal but should differ from one another by a constant value which can be introduced into the circuit by frequency changing either via the comparator or before the measurement of at least one of the frequencies. Advantageously, frequency measurements are performed by means of voltage-to-frequency converters or frequency discriminators; their voltage/frequency characteristics must be absolutely identical.

Figure 2:
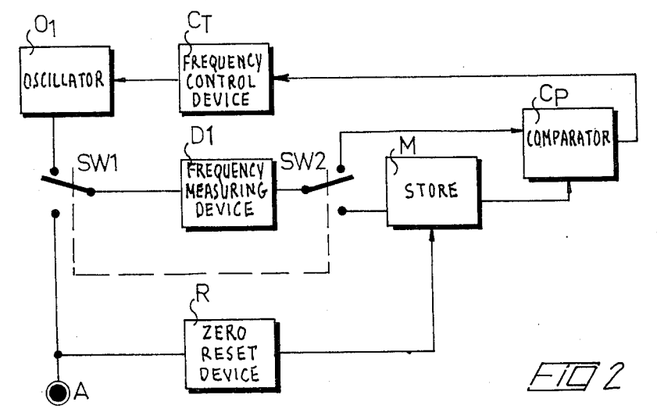
FIG. 2 is a variant of the method shown in FIG. 1.

To overcome this difficulty and to simplify the circuit while using the same measuring device $D_1$, the system shown in FIG. 2 can be used, where like elements have the same references as in FIG. 1. A selector $SW_1$, controlled e. g. by the pulse, connects the input of the device $D_1$ either to input A during the presence of the pulse or to the oscillator $O_1$ after the pulse; synchronously with selector $SW_1$ a second selector $SW_2$ connects the output of the device $D_1$ either to store M, which in this case is disposed between the device D and the comparator, or to the comparator input not connected to the store. In this case, if the frequencies $F_1$ and $F_3$ differ from one another by a constant value there must be a frequency change before the selector $SW_1$.

Figure 3:
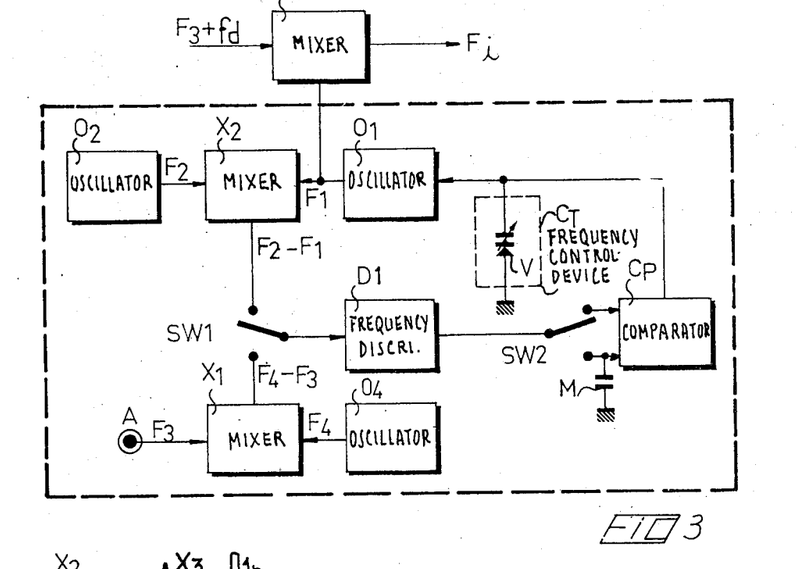
FIG. 3 showns a first form of a system using the method according to the invention.

FIG. 3 relates precisely to such a case which is, for instance, a system for random-frequency electromagnetic detection. Like elements have the same reference as in the previous drawings. In this case the oscillator $O_1$ is the local oscillator of the receiver and the received echos of frequency $F_3$ (which is almost the Doppler frequency $F_d$) are mixed in frequency changer $X_3$ with the signal of frequency $F_1$. The difference frequency $F_3 - F_1$ must therefore be kept constant at the intermediate frequency $F_i$ of the receiver amplification and tuning circuits. The frequency $F_3$ varies around a mean frequency $F_{3,0}$ and $F_3$ can be considered equal to $F_{3,0} + \Delta F$ where $\Delta F$, whether positive or negative, is small in relation to $F_{3,0}$. The circuit for controlling the frequency $F_1$ to the frequency $F_3$ is framed in chain lines. Two oscillators $O_2$, $O_4$ working on fixed frequencies $F_2$, $F_4$ respectively differing from one another by the intermediate frequency $F_i$ provide the auxiliary frequency-changing oscillations for changing the frequency of the local-oscillator signal and the frequency of the pulse to the same frequency. Accordingly, a mixer $X_1$ outputs a signal of frequency $F_4 - F_3$ and a mixer $X_2$ outputs the signal of frequency $F_2 - F_1$. In this case the frequency measuring device $D_1$ is a frequency discriminator centred on the frequency $F_i$. The frequency $F_4$ is so chosen that $F_4 = F_{3,0} + F_i$, so that $F_4 - F_3$ can be put equal to $F_i + \Delta F$ and $F_2 - F_1$ can be put equal to $F_i + \Delta F_1$ where $\Delta F_1$ is positive or negative according to circumstances.

During the life of the pulse when the selectors are in their bottom position, the frequency difference $\Delta F$ leads to the discriminator $D_1$ outputting a voltage $\Delta V$ proportional to $\Delta F$ stored in the store M (a capacitance in the present case). The store output is applied to one of the inputs of the comparator CP, for instance, a difference amplifier. When the pulse has ended and the selectors are in their top position, the discriminator supplies a voltage $\Delta V_1$ proportional to $\Delta F_1$.

If the local oscillator frequency is positioned correctly — i.e., if $F_3 - F_1 = F_i$, then $\Delta F_1 = \Delta F$, since $F_2 - F_4 = F_i$ and so $\Delta V_1 = \Delta V$. No control voltage is applied to the control device CT, represented by a variable-capacitance diode, and the frequency $F_1$ does not alter. However, if $\Delta F = \Delta F_1$, the amplifier CP outputs a voltage proportional to $\Delta V_1 - \Delta V_2$ which changes the frequency of oscillator $O_1$ until $\Delta F_1 = \Delta F$.

Storage of the frequency-proportional voltage signal output by the frequency discriminator entails two contradictory requirements. The charging time of the capacitance must be at most ⅓ to ¼ of pulse duration so that the peak pulse value may be recorded, yet the capacitance discharge time which governs the stability of the intermediate frequency throughout the whole repetition must be from 300 to 400 times greater than the recurrence. Cascading stores to charge larger capacitors considerably increases switching difficulties and difficulties connected with interfering signals inherent in the circuit arrangement.

Figure 4:
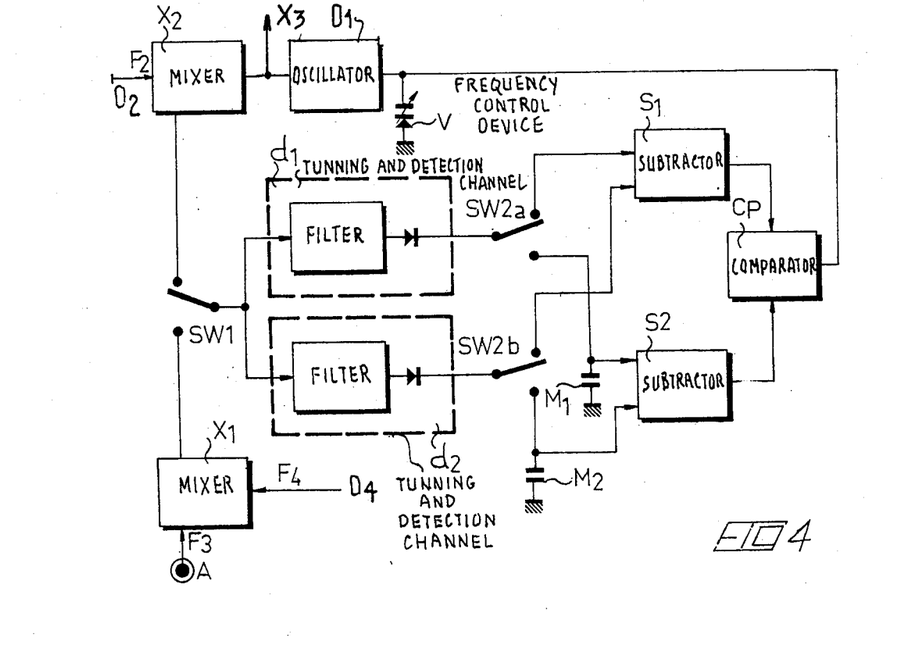
FIG. 4 showns a variant of the system shown in FIG. 3.

To obviate these disadvantages the difference storage circuit arrangement which is shown in FIG. 4 and which virtually obviates the effect of charge losses on the recorded value, can be used. Those elements of FIG. 3 which appear again in FIG. 4 have the same reference as in FIG. 3, but for the sake of clarity the oscillators $O_2$ and $O_4$ and the mixer $X_3$ are not shown in FIG. 4. A separation has been made between the two separate items which usually make up a frequency discriminator, a tuning and envelope detection element, comprising two channels $d_1$, $d_2$ centred on the frequencies $F_i + \Sigma$ and $F_i - \Sigma$ where $\Sigma$ is equal to the maximum value of $\Delta F$, such channels having symmetrical characteristics in relation to the frequency $F_i$, and a subtractor supplies the difference between the signals delivered by the two channels $d_1$, $d_2$. In this variant, one subtractor $S_1$ is used for the signal $F_2 - F_1$ and a second subtractor $S_2$ is used for the signal $F_3 - F_4$, the subtractors usually being difference amplifiers. The output signals from the discriminator channels are stored in $M_1$ and $M_2$ at the inputs of subtractor $S_2$, which therefore measures the difference between the stored values, such difference beng independent of the drifts of the stores provided that the same are properly matched. The selector $SW_2$ is therefore replaced by a double selector $SW_{2a}$, $SW_{2b}$.

The remainder of the description relates to improvements of the invention, of use in all the variants hereinbefore described.

A frequency discriminator is distinguished by a central frequency and a passband — i.e., the permissible frequency departures from the central frequency. As a rule, the amplitude of the maximum frequency swings allowable for the discriminator is adapted to the maximum frequency separation between two consecutive pulses. However, factors such as temperature or component wear may by their variation cause slow changes in the mean value of the frequency of the pulses, in which event the frequency of some pulses departs from the permissible discriminator frequency range and frequency control is disturbed.

According to the invention, the frequency-changing circuit for the pulse comprises, in association with the mixer $X_1$, a controllable-frequency oscillator $O_4$ whose control input is connected to a circuit for slowly controlling the oscillator frequency to the mean value of the pulse frequency.

Figure 5:
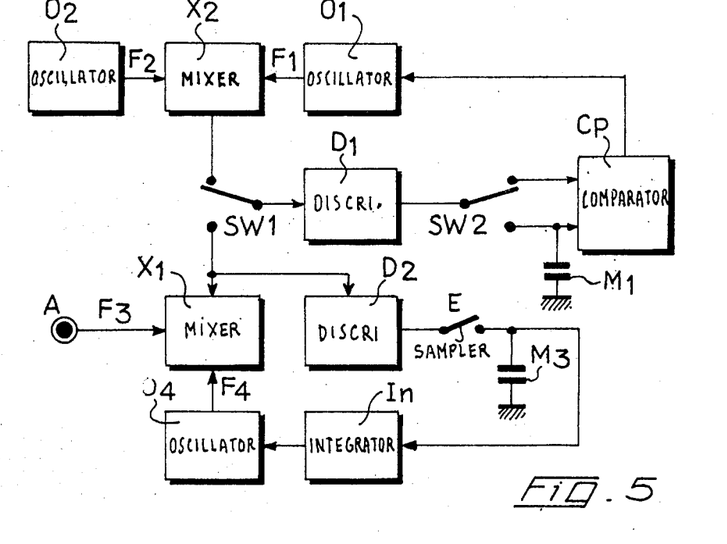
FIG. 5 is a first improvement in the control circuit according to the invention.

FIG. 5 shows a variant of the system shown in FIG. 3 and comprising a "slow" control circuit. In addition to the elements of FIG. 3 there are a discriminator D2 centred on the frequency $F_i$, a sampling device E, a storage circuit $M_3$ and an integrator In. The slow control circuit is connected between the output of mixer $X_1$ and the control input of oscillator $O_4$. The same is therefore used as local oscillator for a first frequency change in a receiver, the oscillator $O_1$ being associated with a second frequency change.

Operation is as follows. During the life of the pulse the mixer $X_1$ delivers a signal of frequency $F_4 - F_3 = F_i + \Delta F$. The difference F causes discriminator $D_2$ to output a voltage $\Delta V$ proportional to $\Delta F$ and stored in storage circuit $M_3$ by way of sampler E which enables the store to charge up during the pulse. The voltage $\Delta V$ is applied to integrating circuit In which prepares a control voltage applied to the oscillator $O_4$. The integrator time constant must be high in relation to the pulse repetition rate so that the control voltage is a d. c. voltage whose value equals the mean value of the voltage stored in $M_3$. The frequency of oscillator $O_4$ is so offset that the mean value of the frequency of the pulses applied to the inputs of the discriminators $D_1$ and $D_2$ is $F_i$.

Such a circuit has the following features:

The discriminators $D_1$, $D_2$ operate at frequencies whose mean value is always the frequency $F_i$ despite possible frequency drifting. The mean value of every voltage stored in $M_1$ or $M_3$ is always zero. Leakage losses in the stores $M_1$ and $M_3$ are therefore very slight. This slow control circuit is of course of use in the system shown in FIG. 4.

Figure 6:
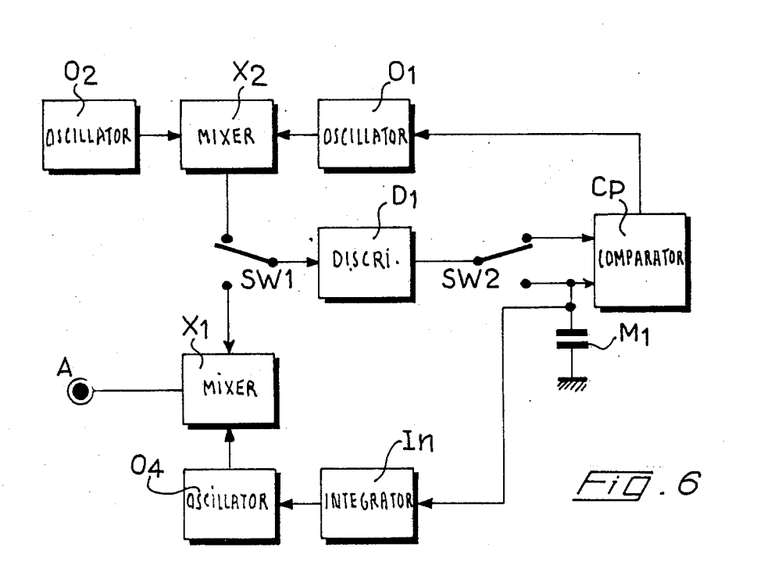
FIG. 6 is a preferred variant of FIG. 5.

FIG. 6 shows a prefered variant of FIG. 5. The discriminator $D_2$, sampler E and store $M_3$ are omitted, since the voltage stored in $M_3$ is identical to the voltage stored in $M_1$, the operation of the selectors $SW_1$, $SW_2$ being identical to the operation of the sampler E during the pulse. Integrator is therefore directly connected to store $M_1$. In other respects the system operates in precisely the same way as in FIG. 5.

Figure 7:
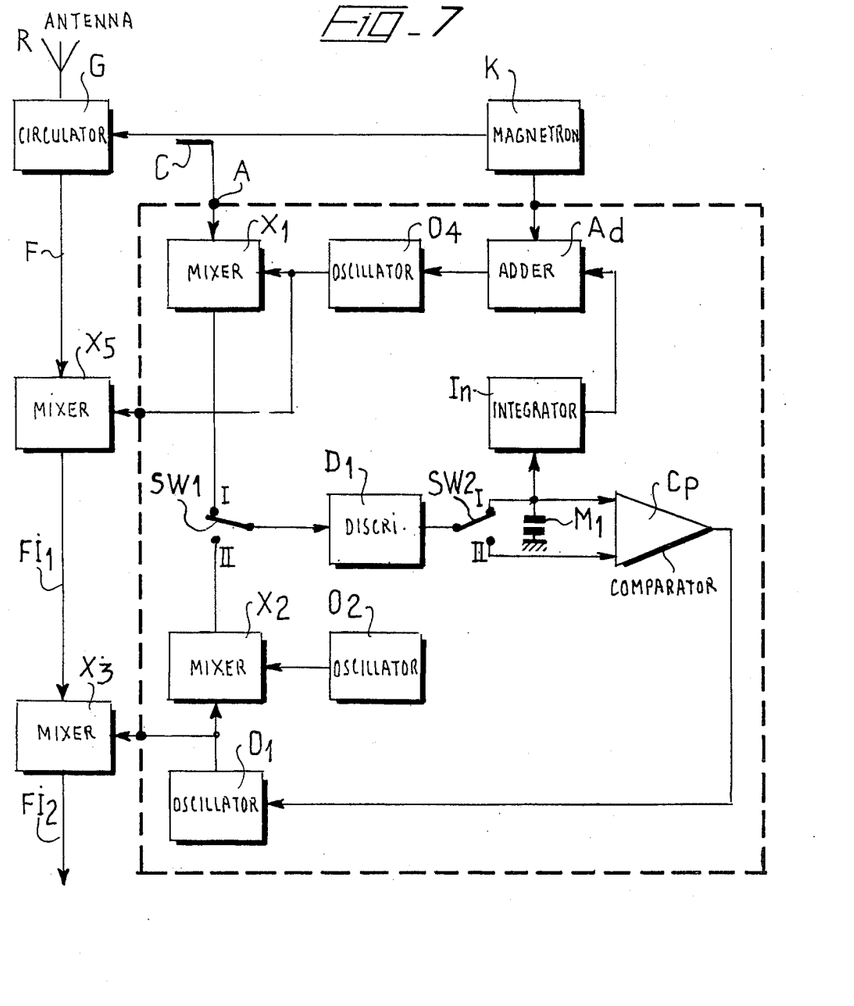
FIG. 7 is a first example showing how the system according to the invention is of use in a varying-frequency radar.

FIG. 7 shows how the system according to the invention is of use in a variable-frequency radar comprising e. g. a magnetron K supplying pulses to an antenna R. The transmitted frequency varies from any one pulse to the next. A reduced proportion of the pulse power is applied to input A of the automatic frequency control circuit by way of a coupler C. On the receiving side of the system a circulator G routes the received signal to the input of the radar receiver, which comprises a first mixer $X_5$ receiving both the received signal and the sinusiodal signal output by the slow control circuit local oscillator $O_4$, the first mixer $X_5$ delivering a received signal having an intermediate frequency $F_{i1}$. A second mixer $X_3$ receives the signal $F_{i1}$ and the sinusoidal output signal of the automatic frequency control circuit local oscillator $O_1$ and delivers a received signal at a stable intermediate frequency $F_{i2}$. In this kind of radar variation of the pulse frequency is provided by mechanical action on the magnetron cavity. Appropriate means which are not shown and which are included in a magnetron K delivers a voltage which is in a approximate relationship to the pulse frequency. For instance, if frequency variation is produced by deformation of the magnetron cavity, the last-mentioned means comprise a potentiometer across which a predetermined and constant potential difference is maintained. The potentiometer is rigidly secured to mechanical deforming means, and so the voltage derived between the potentiometer slider and any one end of the potentiometer is representative of the deformation produced and hence of the transmission frequency of the magnetron K. The latter voltage is used to pre-lock the frequency of the local oscillator $O_4$ briefly before the transmission of each pulse. Accordingly, a voltage adder circuit $A_d$ is interposed between the local oscillator $O_4$ and the integrator $In$. The pre-locking voltage supplied by the magnetron K at a particular instant of time is applied to the adder $A_d$. The latter voltage can be sampled by means of a sampling circuit and a store, neither of which is shown. The resulting pre-locking is coarse. It is an object of the system according to the invention to compensate for the residual frequency variation.

The slow control acts on the frequency of oscillator $O_4$ and comprises a mixer $X_1$ receiving the transmitted pulses via the coupling C, plus the output signal of oscillator $O_4$. The selectors $SW_1$, $SW_2$ are in position I during each pulse. Discriminator $D_1$ receives the output signal of mixer $X_1$ and supplies a voltage which is stored in the store $M_1$, the mean value of the latter voltage serving to control the frequency of the oscillator $O_4$ by way of the integrator $In$ and adder $Ad$.

Fast control of the frequency of the oscillator $O1$ is achieved by comparison of the voltage stored in $M_1$ with the output voltage of discriminator $D_1$ when the switches are in position II, the latter voltage representing the frequency of the oscillator $O1$ after frequency changing by means of the mixer $X_2$ and of the fixed-frequency oscillator $O2$. These controls operate in the same way as in the systems shown in FIG. 1 to 6.

A disadvantage of the system hereinfore described is the need for double frequency changing in the receiving channel. The first frequency change introduces a first intermediate frequency whose mean value is constant but whose instantaneous value depends upon the residual frequency difference between the transmitter and the local oscillator due to unsatisfactory frequency pre-locking thereof. The fast frequency control transposes this residual difference in value and sign to the frequency of the second frequency change local oscillator. The residual error of the second intermediate frequency is therefore reduced to tolerable values of the order of a few hundred kilohertz.

Because the first intermediate frequency is relatively high, there is more particularly a slight impairment of the signal-to-noise ratio. Also, when the system according to the invention is used in monopulse radars difficulties arise as regard amplitude, phase, function and frequency identity of channels.

To obviate these disadvantages the invention provides an automatic frequency control system which is used in an electromagnetic detection receiver and which involves just a single frequency change in the receiver channel, the automatic frequency control system carrying out all the steps necessary for proper frequency locking of the local oscillator.

Figure 8:
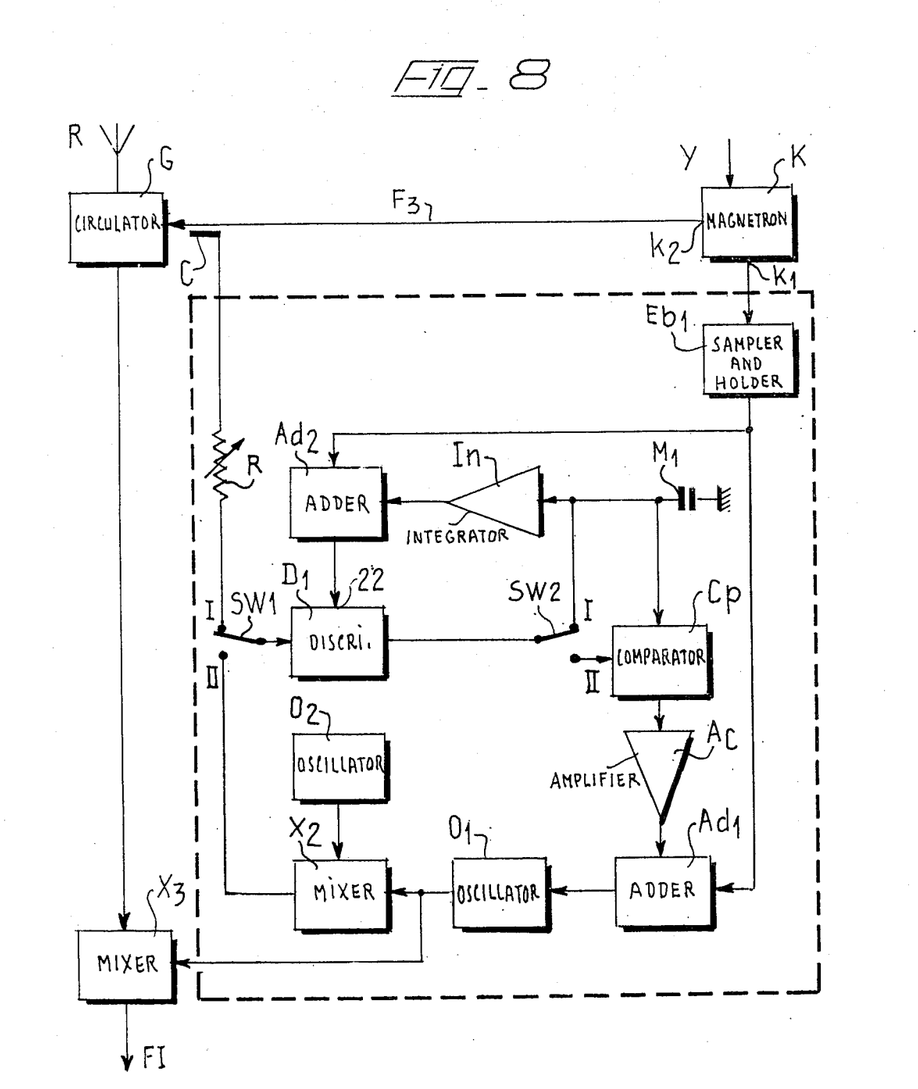
FIG. 8 shows a second improvement of the control circuit according to the invention, of use in an electromagnetic detection receiver.

The system shown in FIG. 8 is used, for instance, in a variable-frequency radar for direct microwave-frequency instantaneous correction at transmission of the frequency of the receiver local oscillator. During each repetition period the local oscillator is locked to a frequency differing from the transmitter frequency by the selected intermediate frequency with the required accuracy. Radar echos are therefore received in the receiver at a substantially constant intermediate frequency. As in the previous figures, like reference denote like elements of the system.

Of the transmitter only the magnetron K has been shown; it is connected to antenna R by way of circulator G. After the circulator the receiver comprises only a mixer $X_3$ receiving a reference signal from the circuit which is framed in chain lines and which comprises the controlled oscillator $O_1$ and the automatic frequency control system according to the invention. The received output signals mixer $X_3$ are changed to the intermediate frequency $F_i$.

The magnetron K operates at an instantaneous frequency $F_3$ in a frequency range of width $2\Delta F$ derived from a control Y acting in accordance with a cycle of some tens to hundred of hertz. During each cycle the magnetron transmits pulses through the agency of a modulator and a general radar synchronizing device (not shown). The magnetron operating frequency can be discovered in two ways. It is found in one way by means of a copying device which forms part of the magnetron itself and which delivers a d.c. signal proportional to the magnetron tuning frequency but with a relatively large uncertainty. The copying device takes the form, for instance, of a potentiometer coupled to the electromagnetic or electomechanical means for tuning the magnetron cavity. In FIG. 8 the copy voltage is available at terminal $k_1$ of magnetron K. The frequency can also be found directly at the microwave output $k_2$ of the magnetron, for instance, by means of a coupler and of a frequency discriminator.

The controlled oscillator $O_1$ is of the kind whose frequency is controlled by voltage. It operates on a frequency $F_1 = F_3 + Fi$ and it must be able to cover the frequency range $2\Delta F$ covered by the magnetron plus the relative frequency drifting of the magnetron and oscillator.

To this end, the automatic frequency control system comprises a frequency-to-voltage converter $D_1$ which receives either the signal of the oscillator $O_1$ after frequency changing by the mixer $X_2$ and oscillator $O_2$, by way of a microwave selector $SW_1$, or the signal at the frequency $F_3$ by way of a coupler C which samples a small proportion of the magnetron output signal, of a variable attenuator R and of the selector $SW_1$. The converter output is connected, via a video frequency selector $SW_2$, either to the positive input of a voltage comparator CP or to the negative input of such comparator and to a storage device $M_1$ symbocally represented by a capacitance. The comparator output is connected to an amplifier and frequency corrector AC whose output is connected via adder $Ad_1$ to the frequency control input of oscillator $O_1$.

Figure 10:
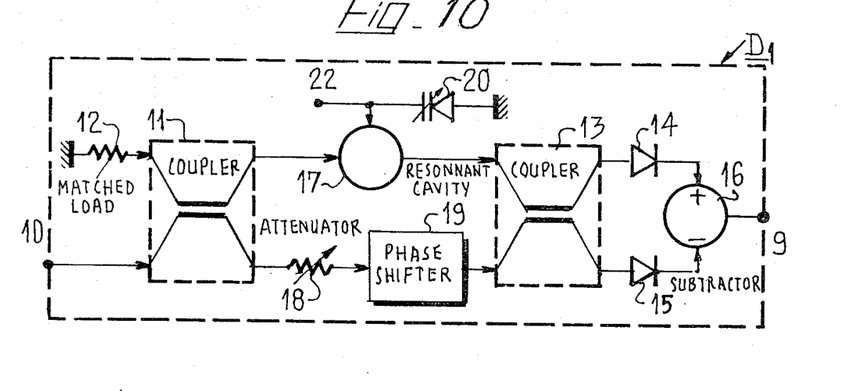
FIG. 10 shows an example of a microwave frequency discriminator with a variable central frequency.
Figure 12:
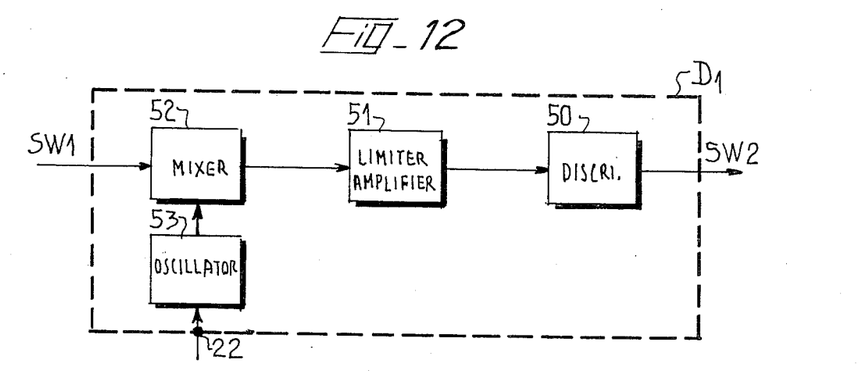
FIG. 12 shows an example of a medium-frequency frequency-to-voltage converter with a variable central frequency.

All the circuits just described together form the fast frequency control loop of the oscillator $O_1$. Slow control of the mean value of the central frequency to voltage converter is provided on the basis of the voltage stored in $M_1$. The latter voltage is applied to an integrating amplifier In whose output is connected via an adder $Ad_2$ to a central frequency control input 22 of the frequency-to-voltage converter $D_1$. The voltage applied to the latter input is a means of shifting the converter central frequency from the frequency at which the frequency measurement is made. FIGS. 10 and 12 show more clearly how this central frequency shift is produced.

In addition to the foregoing controls there is a means for presetting the frequency of the oscillator $O_1$ and the central frequency of the converter $D_1$, the presetting using the copy signal a sampler and blocker $Eb_1$ whose output is connected to the adders $Ad_1$, $Ad_2$.

Immediately before the transmission of a pulse the copy voltage is stored by the samples $Eb_1$ and presets the frequency of the oscillator and the central frequency of the frequency-to-voltage converter to prevent an excessive frequency jump in the control loop. More particularly, the central frequency of the converter remains close to the transmitted frequency despite the presetting. The operative range of the converter is therefore reduced and its efficiency improved. The presetting voltage remains constant throughout the transmission and reception period, whereafter it alters again until the next pulse.

The fast frequency control operates in each period for which the preset remains unchanged. The selectors $SW_1$, $SW_2$ are in position I for the duration of emission of a pulse. The converter $D_1$ delivers to the store $M_1$ a voltage representing magnetron frequency.

Upon the completion of this step the selectors change over to position II and the converter $D_1$ outputs a voltage representing the frequency of the output signal of oscillator $O_1$. The latter voltage is compared in comparator CP with the voltage previously stored in store $M_1$ and the difference is amplified by the device AC, whose output is looped back to the frequency control input of the local oscillator $O_1$ so as to reduce the amount of such difference.

The system thus looped adapts the output voltage of the converter to the value previously stored at the time of transmission of the pulse. Consequently, except for loop error which depends upon loop gain, local oscillator frequency is locked to the appropriate value for radar echo reception.

The selectors $SW_1$, $SW_2$ look like electromechanical devices in the drawings but are in fact electronic devices, the selector $SW_1$ operating at microwave frequencies and the selector $SW_2$ at video frequencies. These devices are familiar to those skilled in the art.

Figure 9:
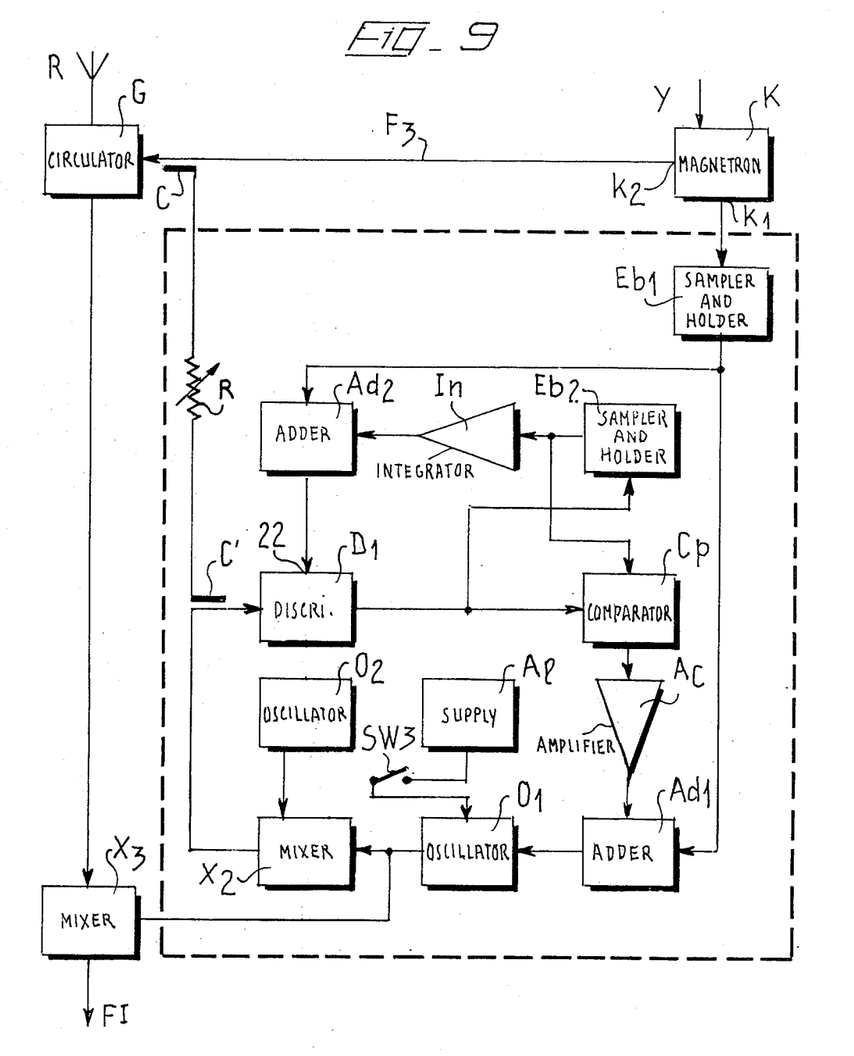
FIG. 9 shows a variant of FIG. 8.

FIG. 9 shows that it is even possible not to use the selectors. Apart from their omission, all the other elements of FIG. 8 are used in FIG. 9 and operate in the same way. The microwave frequency selector $SW_1$ is omitted and the output mixer $X_2$ is directly connected to the input of the converter $D_1$. The signal transmitted by the magnetron is in this case applied to the converter via a coupler C. In the absence of transmission the output signal of mixer $X_2$ is transmitted to the converter. During the transmission of a pulse the latter signal is suppressed by the power supply Al of oscillator $O_1$ being interrupted by means of a switch $SW_3$.

The selector $SW_2$ is omitted at the converter output and the converter is directly connected to the positive input of the comparator CP. A sampling and blocking device $Eb_2$ is disposed between the converter output and the negative input of the comparator and is synchronized with switch $SW_3$. The store $M_1$ is omitted, its function being performed by the device $Eb_2$.

During the pulse the voltage representing magnetron frequency is stored in the samples $Eb_2$. At this time the local oscillator stops operating so that the converter receives only the magnetron signal. After the pulse the stored voltage applied to the negative input of the comparator is compared with the voltage output representing the frequency of the oscillator $O_1$ applied to the positive input. In other respects operation is exactly as for FIG. 8.

FIG. 10 shows an example of a frequency-to-voltage converter or frequency discriminator operating at microwave frequencies and having a controllable central frequency. Like most microwave discriminators it is embodied by a 3db directional input coupler 11, one input 10 of which receives the microwave signal and the other input of which is connected to a matched load 12, a 3db directional output coupler 13 whose outputs are connected to detectors 14, 15, and a comparator 16 which outputs to a terminal 9 and, between the two couplers, two microwave connections of the same electrical length. One such connection comprises a resonant cavity 17 and the other comprises an adjustable attenuator 18 in series with a phase shifter 19 serving to produce and adjust equality of the electrical lengths and equality of gain of the two connections at the central frequency. The discriminator central frequency is determined by the resonant frequency of cavity 17, which is modified by means of a variable-reactance element 20 such as a variable-capacitance diode coupled to the cavity and acted on by the frequency control voltage applied at terminal 22. The latter voltage varies the diode capacitance and therefore the tuned frequency of the system embodied by the diode and the cavity. At the output from the detectors 14 and 15 the signals are of the same phase and of the same amplitude when the signal at the input 10 has the same frequency as the cavity resonant frequency. The output signal at 9 is zero. Off the resonant frequency the output signal is substantially proportional to the resonant frequency of the cavity.

For this kind of discriminator the amplitudes of the input signals must be exactly the same during the two consecutive operations of storage and combination. This can be achieved either by means of an amplitude-limiting circuit at the discriminator input or by an instantaneous amplitude control circuit.

The former case can be considered for operating frequencies below 1000 MHZ in the present state of the art. Above this frequency a fast amplitude control loop must be used and a case of this kind will now be described with reference to FIG. 11.

Figure 11:
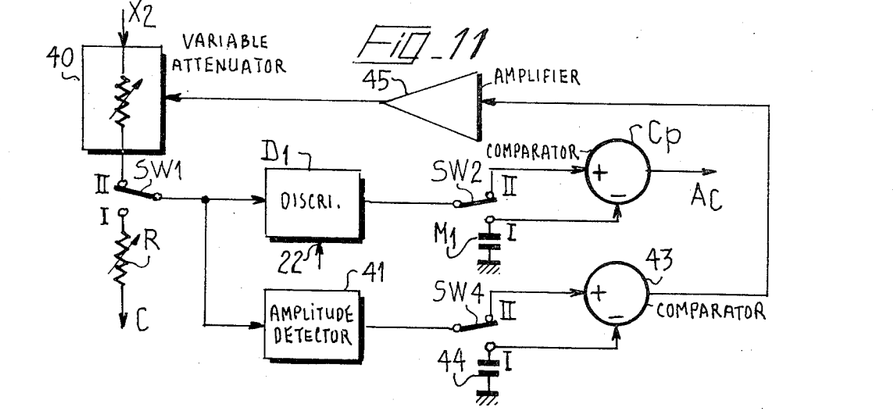
FIG. 11 shows an amplitude control loop.

The principle on which an amplitude control loop operates is the same as for a frequency loop. A fast attenuator 40 is interposed between mixer $X_2$ and selector $SW_1$. A level detector 41 is connected to selector $SW_1$ and, by way of a selector $SW_4$, supplies a signal either to a store 44 and the negative input of a comparator 43 (position I) or to the positive input of the comparator (position II) An amplifier and corrector 45 closes the loop between comparator 43 and the gain control input of attenuator 40. The selectors $SW_1$, $SW_2$, $SW_4$ are synchronized. In position I a signal representing the amplitude of the signal received by coupler C is stored in store 44. In position II the signal representing the amplitude of the output signal of the mixer $X_2$ is compared with the signal in store and the difference is amplified and restores the amplitude to equality by means of the attenuator. TO prevent any coupling between the amplitude loop and the frequency loop, the amplitude loop pass band is wider than that of the frequency loop.

FIG. 12 shows an example of a frequency-to-voltage converter $D_1$ using a frequency discriminator 50 operating not on microwave but at a lower frequency, e.g. 150 MHZ. The discriminator 50 can be, for instance, of the FOSTER-SEELEY kind. It is preceded by a limiting amplifier 51, and so the amplitude loop can be omitted. Before the limiter a frequency change is provided by a mixer 52 which receives the microwave input signals from selector $SW_1$ and a reference signal produced by an auxiliary controllable-frequency microwave oscillator 53. Its control input 22 receives the sum of the presetting voltage and the voltage of the slow control loop, as shown in FIGS. 8 and 9.

Linearization of the frequency controls of the oscillators in the case of a single-frequency change receiver is not as critical as in the case of double-frequency change receivers. The operating conditions of the system do not require the central frequency of the frequency-to-voltage converter to be very stable (e.g. ± 2 to 3 MHZ) nor need the frequency/voltage characteristic be particularly linear. Accuracy depends only upon the identity of the operating points on the frequency/voltage characteristic during the two phases of storage and recombination.

Of course, the invention is not limited to the embodiment described and shown which was given solely by way of example.

What is claimed, is:

1. A system for bringing the frequency of an oscillator under the control of the frequency of the carrier of a pulse, said system comprising means for measuring and storing a parameter characteristic of the carrier frequency value throughout the duration of the pulse, means for measuring the same parameter in respect of the frequency of the oscillator to be controlled, comparing means for comparing, after the pulse, the second measured parameter with the first and stored measured parameter, and control means for controlling the frequency of said oscillator in function of the result of said comparison.

2. A system according to claim 1, wherein said comparing means comprises a comparator having two inputs and an output coupled to said control means, and wherein said means for measuring and storing a parameter characteristic of the carrier frequency value of the pulse and for measuring the same parameter in respect of the frequency of the oscillator comprises a frequency to voltage converter, a store connected to one of the two inputs of the comparator, and two synchronized selectors for applying to the converter input either the pulse or the oscillator output signal in the absence of pulse, and for connecting the converter output either to the store or to the other input of the comparator respectively.

3. A system according to claim 1, wherein said comparing means comprises a comparator having two inputs and an output coupled to said control means, and wherein said means for measuring and storing a parameter characteristic of the carrier frequency value of the pulse and for measuring the same parameter in respect of the frequency of the oscillator comprises a frequency-to-voltage converter having two symmetrical channels, the inputs of which are connected together, a first and a second subtractor having their outputs respectively connected to the inputs of the comparator, two stores connected respectively to the two inputs of the first subtractor and three synchronized selectors, one of them being connected to the common input of said channels for applying to said common input either the pulse or the oscillator output signal after the pulse and the two other selectors being connected respectively to the outputs of said channels for connecting said two outputs either to the two stores respectively during the pulse, or to the two inputs respectively of the second subtractor, after the pulse.

4. A system according to claim 3 of use if the oscillator frequency F1 differs from the pulse frequency F3 by a constant value F$i$ further comprising a first frequency changing circuit connected between the oscillator output and the respective input of the first selector and a second frequency changing circuit connected between an input terminal for the pulse and the respective other input of the first selector, the frequencies of the transposing signals generated in said changing circuits and mixed with the signals of frequency F1 and F3 respectively, differing from one another by the constant value F$i$.

5. A system according to claim 4, wherein the first frequency-changing circuits has a controllable-frequency oscillator whose control input is coupled with a circuit providing a slow control for bringing the frequency of the oscillator to the mean value of the pulse frequency.

6. A system according to claim 5, wherein said slow control circuit comprises in series a frequency-to-voltage converter, a sampling device, a storage circuit, and an integrator, the latter being connected between the output of the frequency-changing circuit and the control input of the oscillator.

7. A system according to claim 5, wherein said control circuit comprises an integrator connected between the storage circuit and the control input of the oscillator.

8. A system according to claim 2 wherein said frequency-to-voltage converter has a controllable central frequency and comprises a frequency control input, said system further comprising means for slowly controlling the central frequency of the converter to the mean value of the pulse frequency.

9. A system according to claim 8, wherein the frequency-to-voltage converter is a microwave frequency discriminator; said system comprising further an amplitude control loop which comprises a variable attenuator having a gain control input in series between the oscillator to be controlled and the converter, an amplitude detector connected to the converter input, means for storing the detector output signal reprsenting pulse amplitude, means for comparing the detector output signal representing the oscillator signal amplitude with the stored signal, and a correcting amplifier in series between the comparator means and the attenuator gain control input.

10. A system according to claim 8, wherein the frequency-to-voltage converter comprises a frequency discriminator preceded by a limiting amplifier and by frequency-changing means in the form of a mixer and of an auxiliary controllable-frequency oscillator receiving the presetting signal and the slow control signal.

11. A pulse radar receiver using the system according to claim 7 comprising in series two frequency-changing circuits for the received signal, and wherein the first such circuit comprises a mixer connected to the slow-control-circuit oscillator, and the second frequency-changing circuit comprises a mixer connected to the automatic frequency control circuit oscillator.

12. A pulse radar receiver using the system according to claim 8, comprising a frequency-changing circuit for the received signal, and wherein such circuit comprises a mixer connected to the controlled oscillator.

13. A pulse radar receiver using the system according to claim 9, comprising a frequency-changing circuit for the received signal, and wherein such circuit comprises a mixer connected to the controlled oscillator.

14. A pulse radar receiver using the system according to claim 10 comprising a frequency-changing circuit for the received signal, and wherein such circuit comprises a mixer connected to the controlled oscillator.

15. A pulse radar receiver according to claim 12 comprising a magnetron delivering in additional to the transmission pulses a copy signal representing the transmitted frequency, and wherein the automatic frequency control system comprises a first adder for adding the copy signal to the frequency control signal of the controlled oscillator produced by the control circuit and a second adder for adding the copy signal to the frequency control signal of the frequency-to-voltage converter produced by the slow control circuit.

* * * * *